United States Patent [19]

Kreutzev et al.

[11] 4,415,826

[45] Nov. 15, 1983

[54] SUPPORT AND CONNECTION DEVICE FOR A DISC-SHAPED PIEZOELECTRIC RESONATOR

[75] Inventors: Hans Kreutzev; Werner Mattuschka, both of Munich, Fed. Rep. of Germany

[73] Assignee: Siemens Aktiengesellschaft, Berlin & Munich, Fed. Rep. of Germany

[21] Appl. No.: 385,031

[22] Filed: Jun. 4, 1982

[30] Foreign Application Priority Data

Jul. 16, 1981 [DE] Fed. Rep. of Germany ... 8120939[U]

[51] Int. Cl.$^3$ ............................................. H01L 41/00
[52] U.S. Cl. .................................... 310/354; 310/345; 310/353
[58] Field of Search ................. 310/312, 345, 351–354

[56] References Cited

U.S. PATENT DOCUMENTS

| 2,385,666 | 9/1945 | Watrobski | 310/355 |
| 2,392,429 | 1/1946 | Sykes | 310/312 |
| 2,806,966 | 9/1957 | Silver | 310/312 |
| 3,162,780 | 12/1964 | Van Dalen et al. | 310/353 |
| 3,521,090 | 7/1970 | Angeloff | 310/353 |
| 4,089,092 | 5/1978 | Jeanguenin et al. | 310/352 |
| 4,357,554 | 11/1982 | Peters | 310/367 |

FOREIGN PATENT DOCUMENTS

| 2720690 | 9/1978 | Fed. Rep. of Germany | 310/355 |
| 55-96714 | 7/1980 | Japan | 310/345 |
| 836630 | 6/1960 | United Kingdom | 310/353 |

*Primary Examiner*—J. D. Miller
*Assistant Examiner*—D. L. Rebsch
*Attorney, Agent, or Firm*—Hill, Van Santen, Steadman & Simpson

[57] ABSTRACT

In a support and connection device for a disc-shaped piezoelectric resonator, the support elements are bent at their ends relative to the resonator and comprise electrically conductive spring strips which engage into radially-directed resonator slots. Tongues attached to the bent sections form clips at the support elements which are open towards the top and provide pockets which are suitable for receiving conductive adhesive.

1 Claim, 4 Drawing Figures

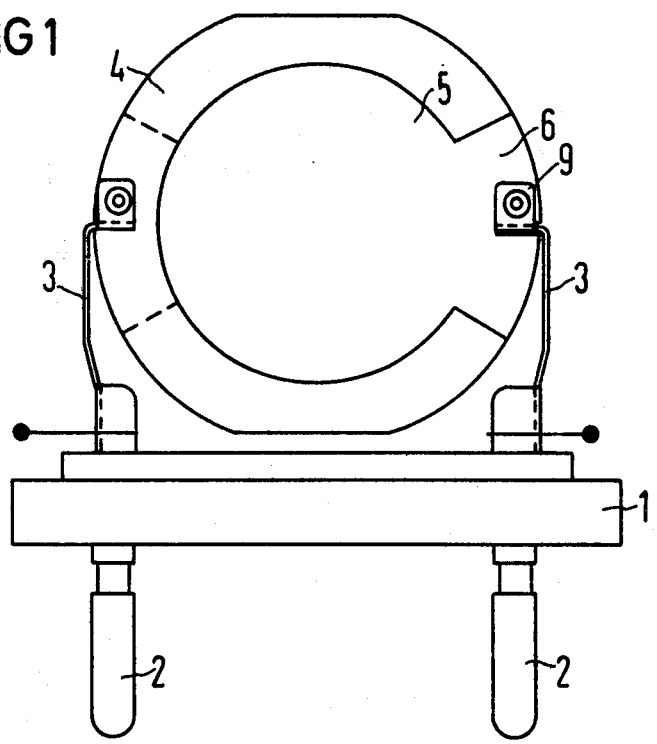
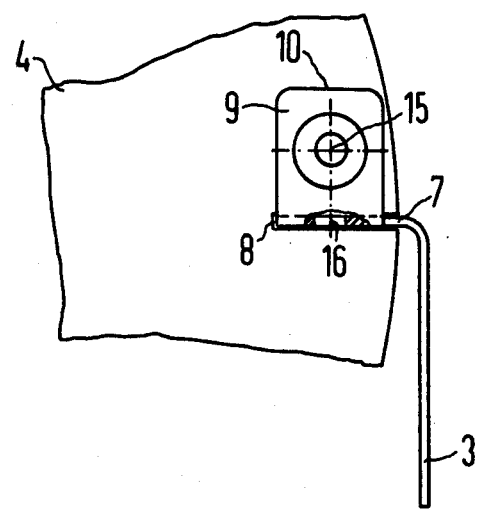

SUPPORT AND CONNECTION DEVICE FOR A DISC-SHAPED PIEZOELECTRIC RESONATOR

BACKGROUND OF THE INVENTION

1. Field of the Invention

The present invention relates to supports, and in particular to a support connection device for a disc-shaped piezoelectric resonator which has excitation electrodes on both sides whose diameter is smaller than the diameter of the resonator and which exhibits a terminal electrode at each side of the resonator which extends up to the edge of the resonator. The terminal electrode is connected to the excitation electrode and is oppositely directed relative to the respective other terminal electrode. The support and connection device comprises two support elements respectively formed of a section of an electrically conductive spring strip which are connected at their ends facing away from the resonator to contact pins which penetrate a bottom plate and are provided at their resonatorside end with a respective pair of tongues directed at right angles relative to the extent of the holding element. The tongues are disposed lying opposite one another by bending down at their root side and respectively accepting an edge section of the resonator therebetween in the area of the terminal electrodes.

2. Description of the Prior Art

Such a connection and holding device is generally known in the art, from the German Gebrauchsmuster No. 18 44 637. In that publication, the resonator is inserted with its edge sections between clips which are formed by the pairs of tongues of the holding elements, being inserted in such a manner that the tongues of each pair of tongues which are resilient relative to one another resiliently pinch the edge of the resonator. By introducing a conductive glue between the resonator and the holding element tongues, a glued connection between the holding elements and the resonator is produced in addition to the pinch mount of the resonator. By so doing, the terminal electrodes connected to the excitation electrodes are at the same time connected to an alternating voltage source. In the direction towards the bottom plate, or respectively, in the direction opposite thereto, the resonator, given such a support and connection device, however, is only fixed by the clamp effect of the tongues and the glued connection between the tongues and the resonator, whereby, moreover, the retaining effect of the terminal electrodes on the resonator also plays a role. When such a resonator mount is exposed to stronger impacts, for example, blows or vibrations, the terminal electrodes can release from the resonator or, respectively, an interruption of the terminal electrodes can occur.

SUMMARY OF THE INVENTION

It is therefore the object of the present invention to provide a device of the type generally set forth above which is constructed in such a manner that the resonator is fixed in all directions in its provided position by positive lock contours and that the mounting of the resonator, i.e. the connection of the resonator to the retaining elements, can nonetheless be undertaken in a relatively uncomplicated manner.

According to the present invention, the above object is achieved in that two support elements are provided at the resonator-side end with bent-down end sections to be directed towards one another, that the resonator exhibits radially-directed incisions in the area of its terminal electrodes for receiving the bent-down end sections of the holding elements, and that the tongues are attached to the bent-down end section of the holding elements. By so doing, a connection and holding device for a disc-shaped resonator is created which holds the resonator secure against jolts in all directions.

It is provided according to a further feature of the invention that the free ends of the tongues are provided facing away from the bottom plate.

In this manner, the tongues advantageously form pockets, open at the top, i.e. easily accessible pockets for receiving a conductive adhesive or a conductive glue which, in particular, improves the electrical connection between the support elements and the terminal electrodes of the resonator.

It can also be further provided within the scope of the invention that the tongues are provided with a respective central, calotte-stamping which is directed towards the resonator and that the stamping exhibit at least one passage in their apex area, and in that the bent-down end sections of the holding elements are provided with at least one passage within the resonator incisions.

By so doing, passages for the conductive adhesive or the conductive glue are advantageously created so that the same can penetrate to all locations which are of importance for creating a bit connection between the support elements and the terminal electrodes of the resonator.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a side elevation of a resonator connected to support elements in accordance with the invention;

FIG. 2 is a detailed view of the interlocking of the support element and a resonator;

DESCRIPTION OF THE PREFERRED EMBODIMENTS

Figure 3:
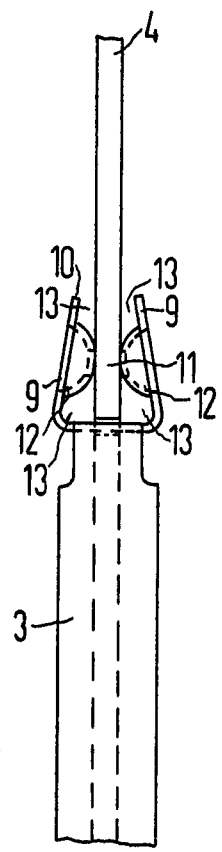
FIG. 3 is a partial end view illustrating a resonator and a support element as viewed in the direction of the principle surfaces of the resonator.

Referring to the drawings, an embodiment of the invention is illustrated in FIG. 1 as comprising a bottom plate 1 of a resonator housing which is penetrated by two terminal pins 2. At the resonator side of the bottom plate 1, support elements 3 are provided, each of the support elements 3 comprising a section of an electrically conductive spring strip which is connected to the end of a respective terminal pin 2 projecting away from the bottom plate, for example, by welding. The support elements 3 essentially extend in the same direction as the terminal pins 2 and are positioned opposite one another with flat sides thereof facing one another. Thereby, the spacing of the two support elements 3 is dimensioned in such a manner that it approximately corresponds to the diameter of a circular disc-shaped resonator 4 which is to be fixed by the support elements.

The resonator 4 has two principle surfaces each of which is provided with central excitation electrodes 5. The excitation electrode does not extend up to the edge of the resonator, so that an electrode-free strip is present along the edge. It is only in a specific edge section at each side of the resonator that the terminal electrode 6 is provided which is interconnected to the excitation electrode on the same side of the resonator and extends up to the edge of the resonator. Since the terminal electrode 6 on the one side of the resonator is oppositely directed relative to the terminal electrode on the other side of the resonator, an electrode-free section always lies on the other side of the resonator opposite each of the terminal electrodes.

At their resonator-side end, the support elements 3 are provided with a bent-down end section 7 which is dimensioned in such a manner that it can be inserted into a radially-directed slot 8 in the resonator 4. The slots 8 are provided in the area of the terminal electrode 6 and lie on the same diameter. In order to insert the resonator 4 into the connection and support device, the connection elements 3 must be spread apart somewhat until the end section 7 can penetrate into the slots 8. Pairs of tongues 9, provided at right angles relative to the extent of the support elements 3 in the area of the end sections 7 and integrally connected to the support elements 3 are bent down toward the end section 7 of the support elements 3 in such a manner that their free ends 10 point upwardly, as illustrated in the drawing, i.e. are directed away from the bottom plate 1. By so doing, the two tongues 9 of each support element 3 form clips which accept an edge area 11 of the resonator therebetween.

Figure 4:
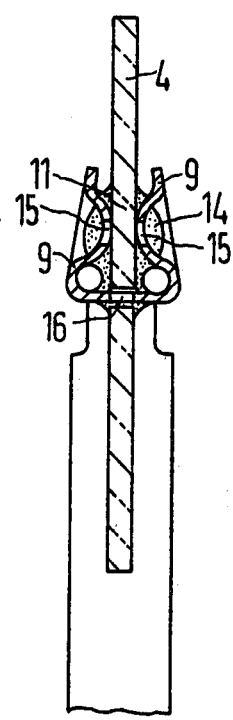
FIG. 4 is an end view, similar to that of FIG. 3, and shown in section.

The tongues 9 exhibit calotte-like stampings 12 (FIGS. 2, 3 and 4) which are directed towards the resonator 4. The tongues 9 support themselves against the resonator 4 with the stampings 12. By so doing, the tongues 9 form pockets 13 which open towards the top of the support elements 3 and in which conductive adhesive 14 (FIG. 4) easily can be introduced.

So that the conductive adhesive 14 can proceed unimpeded to all locations which are to be moistened by the adhesive, a passageway 15 is provided in the apex area of the stampings 12. A further passageway 16 is provided between the tongues 9 in each end section 7 for the same purpose.

Therefore, overall, a shake-proof connection is produced between the support elements 3 and the resonator 4, whereby a good electrical connection between the excitation electrodes 5 and the terminal pins 2 is created as the same time.

Although we have described our invention by reference to particular illustrative embodiments thereof, many changes and modifications of the invention may become apparent to those skilled in the art without departing from the spirit and scope of the invention. We therefore intend to include within the patent warranted hereon, all such changes and modifications as may reasonably and properly be included within the scope of our contribution to the art.

We claim:

1. In combination, a resonator and a support and connection device, comprising a disc-shaped resonator body;

a pair of excitation electrodes carried on opposite surfaces of said body, each of said excitation electrodes having a diameter which is less than that of said body;

a pair of terminal electrodes, each integral with a respective excitation electrode and each extending up to the edge of said body at a location diametrically opposite to that of the other terminal electrode;

a pair of radially-extending slots in said body, each of said slots being in the area of a respective terminal electrode and opening radially outwardly through the edge of said body;

a support plate;

a pair of spaced-apart terminal pins extending through said support plate;

a pair of support elements each comprising electrically conductive spring material, each connected to a respective terminal pin, and each further comprising a bent section received in a respective slot and including a passageway therethrough, and a pair of spaced tongues extending away from said plate forming a pocket and clampingly receiving said body in the area of a respective terminal electrode, each of said tongues including an inwardly directed dimple including a passageway therethrough; and a conductive adhesive in the interstices formed by said body, said pockets and said passageways.

* * * * *